United States Patent [19]

Atwood et al.

[11] Patent Number: 5,065,364

[45] Date of Patent: Nov. 12, 1991

[54] APPARATUS FOR PROVIDING BLOCK ERASING IN A FLASH EPROM

[75] Inventors: Gregory E. Atwood, San Jose; Albert Fazio, Los Gatos; Richard A. Lodenquai, San Jose, all of Calif.

[73] Assignee: Intel Corporation, Santa Clara, Calif.

[21] Appl. No.: 407,645

[22] Filed: Sep. 15, 1989

[51] Int. Cl.⁵ ............... G11C 11/34; G11C 7/00; G11C 8/00

[52] U.S. Cl. .................... 365/185; 365/218; 365/230.03; 365/238.5

[58] Field of Search .......... 365/218, 185, 230.03, 365/238.5

[56] References Cited

U.S. PATENT DOCUMENTS

| | | | |
|---|---|---|---|
| 3,500,142 | 3/1970 | Kahng | 365/185 |
| 3,660,819 | 5/1972 | Frohman-Bentchkowsky | 365/185 |
| 3,728,695 | 4/1973 | Frohman-Bentchkowsky | 365/185 |
| 3,755,721 | 8/1973 | Frohman-Bentchkowsky | 365/185 |
| 4,099,196 | 7/1978 | Simko | 365/185 |
| 4,203,158 | 5/1980 | Frohman-Bentchkowsky et al. | 365/185 |
| 4,301,518 | 11/1981 | Klaas | 365/207 X |
| 4,425,632 | 1/1984 | Iwahashi et al. | 365/185 |
| 4,451,905 | 5/1984 | Moyer | 365/185 |
| 4,503,524 | 3/1985 | McElroy | 365/218 |
| 4,597,064 | 6/1986 | Giebel | 365/238.5 |
| 4,599,707 | 7/1986 | Fang | 365/185 |
| 4,677,590 | 6/1987 | Arakawa | 365/185 |
| 4,698,787 | 10/1987 | Mukherjee et al. | 365/185 |
| 4,884,239 | 11/1989 | Ono et al. | 365/218 |
| 4,888,734 | 12/1988 | Lee et al. | 365/185 |
| 4,949,309 | 8/1990 | Rao | 365/218 |

FOREIGN PATENT DOCUMENTS

| | | | |
|---|---|---|---|
| 0050005 | 4/1982 | European Pat. Off. | |
| 86859 | 5/1985 | Japan | 365/185 |
| WO8301146 | 3/1983 | PCT Int'l Appl. | |

*Primary Examiner*—Joseph A. Popek
*Assistant Examiner*—Michael A. Whitfield
*Attorney, Agent, or Firm*—Blakely, Sokoloff, Taylor & Zafman

[57] ABSTRACT

A flash EPROM memory array having vertical blocking is described. The array is organized into a plurality of vertical (column) blocks. Each block includes a source region switch which couples all the source regions in the memory cells in its respective block to a programming potential, ground or a disturb inhibit potential. Each of the blocks may be erased without disturbing the programming in the other blocks.

11 Claims, 2 Drawing Sheets

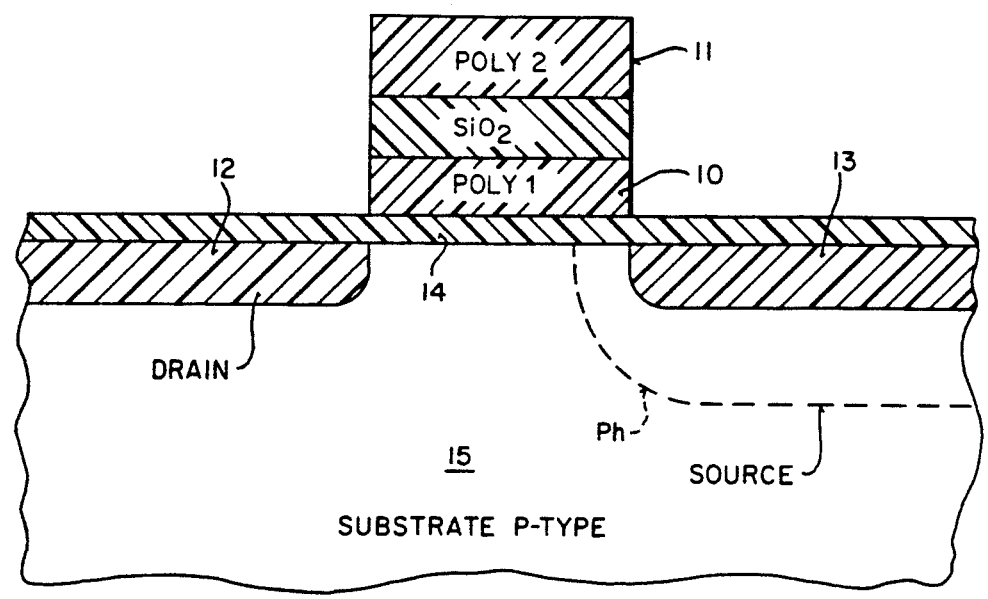
FIG_1 (PRIOR ART)
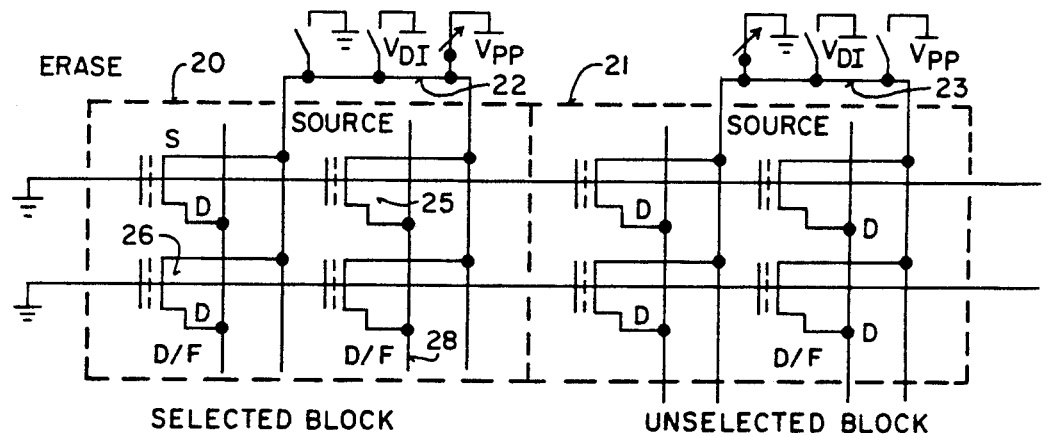
FIG_2A
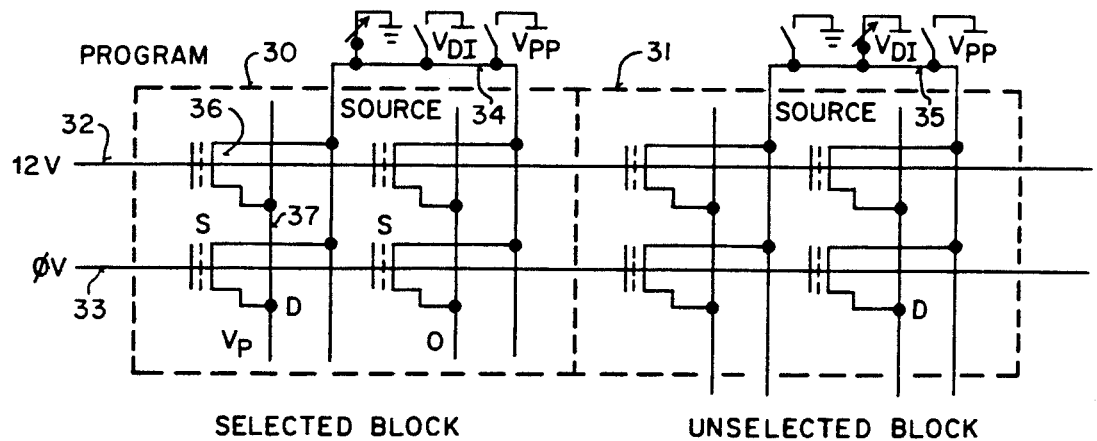
FIG_2B

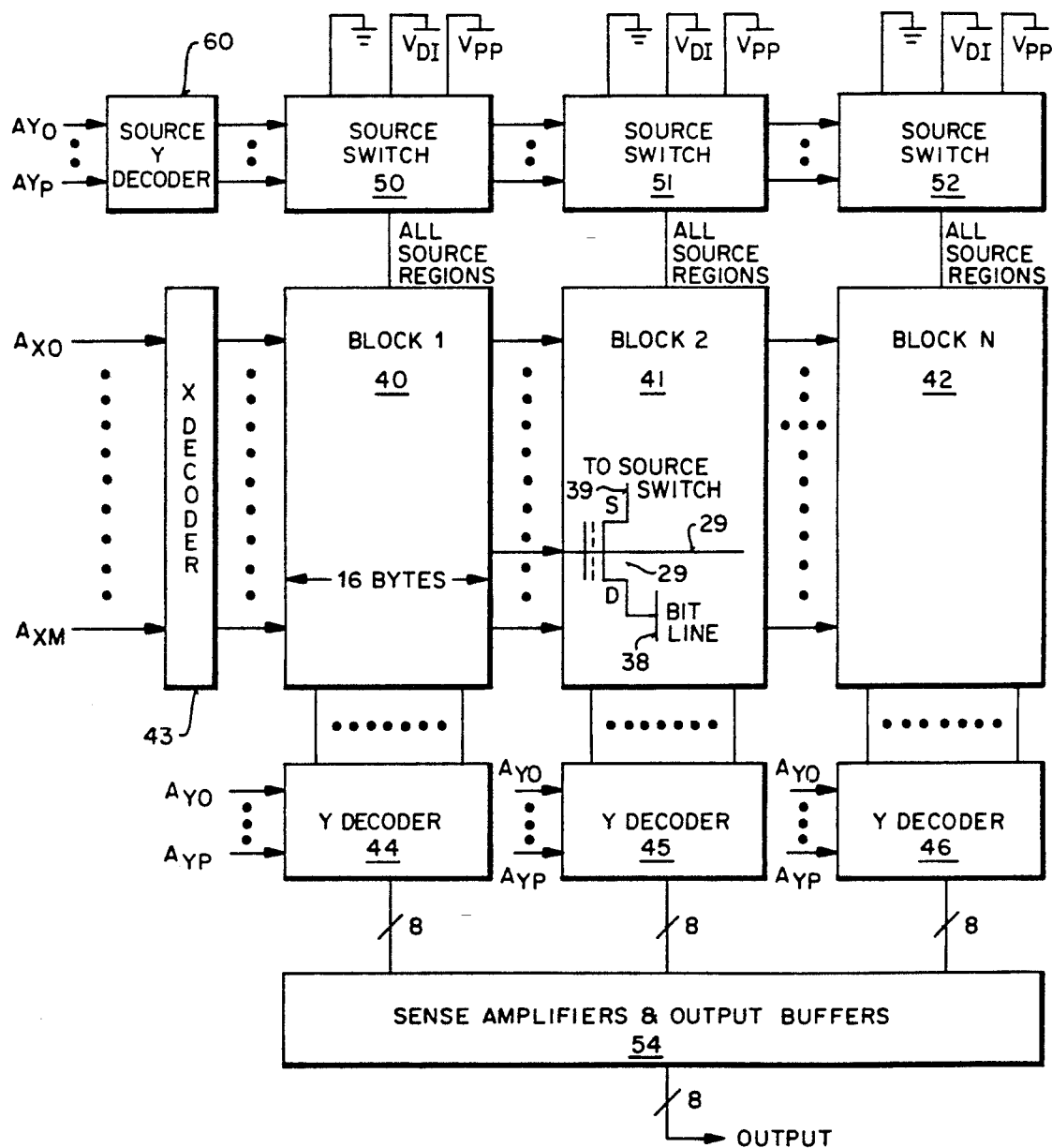

APPARATUS FOR PROVIDING BLOCK ERASING IN A FLASH EPROM

BACKGROUND OF THE INVENTION

1. Field of the Invention

The invention relates to the field of electrically programmable read-only memories, particularly those employing floating gate memory devices.

2. Prior Art

Metal-oxide-semiconductor (MOS) electrically programmable read-only memories (EPROMs) frequently use memory cells that have electrically isolated gates (floating gates). These floating gates are typically completely surrounded by insulation and formed from a polycrystalline silicon (polysilicon) layer. Information is stored in the memory cells or devices in the form of charge on the floating gates. Charge is transported to the floating gates by a variety of mechanisms such as avalanche injection, channel injection, tunnelling, etc., depending on the construction of the cells. The cells are erased generally by exposing the array to ultraviolet radiation. An example of these cells can be found in U.S. Pat. Nos. 3,500,142; 3,660,819; 3,755,721; and 4,099,196. In some cases these cells are electrically erasable (EEPROM cell). An example of such a cell is shown in U.S. Pat. No. 4,203,158.

The invention of the present application is used with an EPROM cell particularly one which is electrically erasable, referred to as a "flash" EPROM cell. The cell used with the present invention is described in copending application, Ser. No. 253,775, entitled Low Voltage EEPROM Cell, filed Oct. 5, 1988, and assigned to the assignee of the present invention.

It has been known for many years that when EPROM cells are used in a memory array, circuitry is sometimes required to electrically isolate the devices, one from the other. This may be needed, for example, to permit the reading of one cell without interference from adjacent cells, or for instance, to permit the programming of a cell without disturbing the programming of another cell. For examples of this, see U.S. Pat. Nos. 3,728,695 and 4,698,787.

The closest prior art known to Applicant is U.S. Pat. No. 4,698,787. This patent discloses the use of a cell having asymmetric source and drain regions in a memory array. Methods for providing selective erasing are described. (See column 11, beginning line 54 through column 12, through line 23.) This patent teaches the use of select transistors associated with the word lines for isolating, for example, bytes (see transistor 129 of FIG. 5d). As will be seen, the present invention provides block erasing in an array without use of isolation or other transistors activated by the word line of the array.

SUMMARY OF THE INVENTION

A memory array having a plurality of electrically programmable and electrically erasable memory cells, each having a source region, drain region, floating gate and control gate is described. A plurality of blocks are used, each of which has a plurality of generally parallel bit lines (columns); the drain regions of the cell are coupled to the bit lines. The memory includes a plurality of word lines which are generally perpendicular to the bit lines with each word line being continuous and extending through the blocks; and, in the currently preferred embodiment polysilicon word lines form the control gates of the cells. There is a source switch associated with each of the blocks. Each switch selectively couples all of the source regions of the cells in a given block to one of three potentials. Column address decoder means are used for selecting a plurality of bit lines in one of the blocks for reading and programming. During programming, the source switch of a selected block couples all of the source regions in the selected block to a first potential (e.g., ground). The source regions of the cells in the unselected blocks are coupled to a second potential (e.g., 3.5 volts) by the source switches of the unselected blocks. During erasing all of the source regions in the selected block are coupled to the third potential (e.g., 12 volts) and the source regions of the cells in the unselected blocks are coupled to ground. A portion of the column address decoder means is used to control the source switches. Row address decoder selects word lines in the memory.

BRIEF DESCRIPTION OF THE DRAWINGS

FIG. 1 is a cross-sectional elevation view of a floating gate memory device or cell used in the currently preferred embodiment of the invention.

FIG. 2a illustrates the potentials applied to the source regions for a selected block and unselected block during erasing.

FIG. 2b illustrates the potentials applied to the source regions for a selected block and unselected block during programming.

FIG. 3 is a block diagram of the presently preferred layout of the invented memory.

DETAILED DESCRIPTION OF THE PRESENT INVENTION

A flash EPROM memory array is described which permits selective erasing. In the following description, numerous specific details are set forth such as specific number of bit lines in a block in order to provide a thorough understanding of the present invention. It will, however, be obvious to one skilled in the are that the present invention may be practiced without these specific details. In other instances, well-known processes and well-known circuits have not been described in detail in order not to unnecessarily obscure the present invention.

In a related application entitled "Reference Switching Circuit for Flash EPROM", Ser. No. 365,185, filed June 12, 1989, a circuit which may be used in conjunction with the present invention is described. (This copending application is assigned to the assignee of the present invention.) This circuit prevents disturb conditions in reference devices used in the sense amplifiers coupled to the bit lines.

Referring to FIG. 1, the memory device or cell used with the presently preferred embodiment is formed on a silicon substrate such as the p-type substrate 15 of FIG. 1. (The device of FIG. 1 is shown in a partially fabricated state since this best reveals its structure.) The device includes a pair of spaced-apart doped regions disposed in the substrate specifically a drain region 12 and a source region 13. A polysilicon floating gate 10 is generally disposed above and between these regions and insulated from these regions by a layer of silicon dioxide or other insulative layer 14. The floating gate 10 at the completion of the processing is completely surrounded by insulative layers and hence, electrically floats. A second gate (control gate 11) is disposed above the floating gate 10; in the presently preferred embodiment this gate is fabricated from a second layer of polysilicon. This control gate is a continuous polysilicon strip forming a word line the memory of FIG. 3.

The memory device of the presently preferred embodiment uses asymmetrically doped source and drain regions. The source and drain regions are both doped with an arsenic dopant and the source region is additionally doped with a phosphorous dopant. Hence, the source region is more deeply doped and additionally the source region overlaps the overlying floating gate. The use of these regions in programming and erasing is discussed in the above referenced application.

It will be appreciated that the cell of FIG. 1 may be fabricated using well-known NMOS technology or CMOS technology. The n-channel device illustrated in FIG. 1 may be fabricated directly in a p-type substrate or when an n-type substrate is used may be fabricated in a p-type well formed in the substrate. Other such well-known variations such as employing both p-wells and n-wells are well-known in the art.

As currently employed, the memory devices are programmed (i.e., negatively charging the floating gate) by coupling the word line or control gate 11 to a potential of approximately +12 volts, the drain region to a potential of approximately +∂ volts, and the source region to ground. With these conditions, channel hot electron injection occurs through the oxide layer 14 which layer is approximately 115 Å thick in the currently preferred embodiment. To erase the cell, the drain region is floated, the word line or control gate 11 is grounded and a potential of approximately +12 volts is applied to the source region. Under these conditions, charge is tunnelled from the floating gate. During reading of the cell, a positive potential less than that which would cause charge to transfer onto the floating gate is applied to the control gate (e.g., 5 volts) and a potential (e.g., 1 volt) is applied to the drain region. Current through the device is sensed to determine if the floating gate is or is not negatively charged. As with other floating gate devices, the negative charge on the floating gate shifts the threshold voltage of the device making it less conductive. Thus, with a sense amplifier the presence or absence of charge on the floating gate can be determined. This defines if a cell is programmed with a binary one or zero.

OVERVIEW OF MEMORY ARCHITECTURE

Referring to FIG. 3, the memory cells in the currently preferred embodiment are formed at intersections of word lines and bit lines as is the common practice. The drain terminals of the memory cells are coupled to the bit line. The control gates are formed from continuous strips of polysilicon which extend across the entire array. The generally parallel bit lines are perpendicular to the generally parallel word lines. For example, cell 27 has its drain region coupled to bit line 38, and its source region 39 coupled to source switch 51. The word line 29 extends to a plurality of other cells along the word line.

In accordance with the present invention, the cells are organized into blocks. Each block comprises a plurality of bit lines, for example, each of the blocks 40, 41, and 42 of FIG. 3 in the currently preferred embodiment contain 128 bit lines. The source regions for all the cells in each of the blocks are connected to a common node allowing this node to be switched to one of three potentials by a source switch. There is a source switch associated with each of the blocks, for instance, block 40 is coupled to source switch 50, block 41 to source switch 51 and block 42 to source switch 52.

The X decoder 43 selects a single word line in the memory for each of the addresses applied to it. The Y decoders 44, 45 and 46 for each of the Y addresses select on byte (8 bit lines) from one of the blocks and couples 8 bit lines from the selected block to the sense amplifer and output buffers 54. (Only one block is a selected block for any given Y address.) The source switches are controlled by the source Y decoder 60 which in the currently preferred embodiment is part of the Y decoder 44, 45 and 46, and as will be described decoder 60 causes the source regions of the cells in the selected and unselected blocks to be coupled to one of three potentials for reading, programming and erasing.

ERASE/PROGRAM SOURCE REGION POTENTIALS

Referring to FIG. 2a, the voltages employed during erasing for a selected block and unselected block are illustrated. (A block is selected when cells in that block are selected for programming or reading. Entire blocks are selected for erasing, one at a time.) Block 20 represents a selected block and includes a plurality of memory cells within the block such as cell 25. Block 21 represents an unselected block, again illustrating a plurality of cells disposed within the block. All the source regions of all the cells within block 20 are coupled to a common node or line 22. Similarly, all the source regions for the cells in block 21 are coupled to a common line or node 23.

During erasing, if block 20 is selected, the source regions of the cells are connected to the programming potential ($V_{PP}$) through the source switches shown in FIG. 3. This programming potential in the currently preferred embodiment is +12 volts. The source switches for the unselected blocks are coupled to ground through the source switches, thus line 23 is shown coupled to ground. For erasing, all the control gates are coupled to ground potential. All the drain regions are left floating, thus, for example, line 28 of block 20 and the other bit lines in the selected and unselected blocks are left floating. For these conditions, any negative charge on the floating gates of the cells in the selected block is removed through the source region thus erasing the floating gates (leaving them neutrally charged). Under these conditions, all of the cells in a single block are erased and the memory cells in the unselected blocks remain unchanged.

FIG. 2b illustrates the potentials applied during programming of cells. Again, two blocks are shown, a selected block 30 and an unselected block 31. Each of the blocks contain a plurality of cells with all the source regions of the cells in block 30 being coupled to line 34 and all the source regions of all the cells in block 31 being coupled to line 35. During programming, all the source regions in the selected block are coupled to ground through the source switch and all the source regions in the unselected block are coupled to a potential which shall be discussed, $V_{DI}$ (disturb inhibit potential). In the currently preferred embodiment, $V_{DI}$ is approximately +3.5 volts.

Assume that the X decoder has selected line 32 for programming and that the cells along this word line in block 30 are to be programmed. If, for example, cell 36 is to be programmed (that is, its floating gate is to be negatively charged), the drain region of memory cell 36 is coupled to a program potential $V_P$ (e.g., +7 volts).

while the selected word line 32 is held at 12 volts. Under these conditions charge is transferred from the substrate to the floating gate. Since the word line 33 and the other word lines are held at zero potential, none of the other cells along the bit line 37 are programmed. The unselected bit lines both in block 30 and the unselected blocks are held at zero potential, hence, no programming occurs in the other memory cells, both along the selected word line and unselected word lines.

The programming operation is typically a slow operation and it is possible that the +12 volts applied to the selected word line can cause slow programming in cells along this word line in unselected blocks even though the drain regions of cells in these blocks are connected to ground. This can be prevented by raising the potential on the source regions to, for example, +5 volts (the nominal potential used by the memory). This is discussed in U.S. Pat. No. 4,698,787. However, it has been found that by doing this slow erasing occurs in cells along unselected word lines since these cells have their control gates at zero potential, drain regions at zero potential and source regions at +5 volts. Rather, it has been found to be more effective to hold the source regions at a potential lower than, for example, +5 volts; this potential is shown as the potential $V_{DI}$ in FIG. 2b. In the currently preferred embodiment, this potential is approximately +3.5 volts. This potential is low enough to prevent erasing along unselected word lines yet high enough to prevent programming along selected word lines.

CURRENTLY PREFERRED EMBODIMENT OF FIG. 3

In FIG. 3, only three blocks are shown. In practice, many more blocks are used. Each block contains a plurality of bit lines (e.g., 128 lines). The specific number of blocks, the specific number of bit lines per block and the specific number of word lines are not critical to the present invention.

The Y decoders 44, 45 and 46 may be ordinary decoders which select 8 bit lines (or any other number) from one of the blocks for coupling to the sense amplifiers. A subset of the Y addresses is required by the source Y decoder 60 to provide a signal to indicate which block has been selected and conversely which blocks are not selected. Thus, the signals for the source switches 50, 51, and 52 may come from an intermediate decoding stage and the Y decoder used for selecting the bytes from the blocks, or a separate source decoder 60 may be used. As shown, each of the source switches 50, 51 and 52 couples its respective block to either ground, the disturb inhibit potential or the programming potential $V_{PP}$. These switches may be ordinary switches fabricated from field-effect transistors.

Assume that the entire memory of FIG. 3 is to be programmed with a new program. Before this can occur, all the blocks are erased. As mentioned in connection with FIG 2a, the source switches of each of the blocks couple its respective block (sequentially to minimize current flow) to the $V_{PP}$ potential. The source switches for the unselected blocks maintain the unselected blocks at ground. The Y decoders during this erase operation allow the drains to float. The X decoder couples the word lines to ground potential. In this manner, all of the cells and all of the blocks are erased. (After initial programming, it is expected that one or more blocks will be selected for reprogramming. In this case only the blocks requiring reprogramming are erased.)

Once erasing has occurred, the cells may be programmed. For example, all the cells in block 41 may be programmed—one byte at a time. For programming under these circumstances, the source switches 50 and 52 couple the source regions for blocks 40 and 42 to the disturb inhibit potential. The source switch 51 couples the source regions of the cells in block 41 to ground. The X decoder 43 sequentially selects one word line at a time for programming by coupling that line to +12 volts. Those cells which are to be programmed then have their drain regions coupled to the $V_P$ potential. All the other drain terminals, both in the selected and unselected blocks remain at ground potential. This is done by the Y decoders. The input data determines which of the drain regions are coupled to $V_P$ for programming.

During the reading of data, a word line is selected by the X decoder and for the illustrated embodiment, one byte is selected from one of the blocks. For reading all the source switches, both for the selected and unselected blocks, couple the source regions to ground. The drain regions (bit lines) of the selected cells in the selected blocks are coupled to a potential of approximately one volt. The selected word line is maintained at approximately 5 volts. Whether or not a cell is programmed can then be determined by the conductivity of the cell using ordinary sense amplifiers.

The reference cells used in the currently preferred embodiment are discussed in the above-mentioned patent application, Ser. No. 253,775.

Thus, a memory array for flash EPROMs has been described which permits blocking erasing.

What is claimed is:

1. A memory array having a plurality of electrically programmable and electrically erasable memory cells each having a source region, drain region, floating gate and control gate, comprising:

a plurality of blocks, each of said plurality of blocks having a plurality of generally parallel bit lines coupled to drain regions of a number of said plurality of electrically programmable and electrically erasable memory cells;

a plurality of source switches, one for each of said plurality of blocks, source regions of said number of said plurality of electrically programmable and electrically erasable memory cells in each of said plurality of blocks being coupled to one of said plurality of source switches, each of said plurality of source switches coupling a source region of each of said number of said plurality of electrically programmable and electrically erasable memory cells in a respective one of said plurality of blocks to one of a first potential, a second potential and a third potential at a time;

a plurality of word lines generally perpendicular to said plurality of gnerally parallel bit lines, each of said plurality of word lines being continuous and extending through said plurality of blocks, with each of said plurality of word lines being coupled to a control gate of one of said plurality of electrically programmable and electrically erasable memory cells for each of said plurality of generally parallel bit lines;

row decoder means for decoding row addresses and for selecting during programming a selected one of said plurality of word lines, such that when said selected one of said plurality of word lines is selected, a programming potential is coupled to control gate of said cells for each of said plurality of generally parallel bit lens along said selected one of said plurality of word lines in all of said plurality of blocks; and second decoder means for selecting during programming a selected one of said plurality of blocks by selecting a set of said plurality of generally parallel bit lines in said selected one of said plurality of blocks for programming and selecting one of said plurality of source switches associated with said selected one of said plurality of blocks to couple source regions of a number of said plurality of electrically programmable and electrically erasable memory cells in said selected one of said plurality of blocks to said first potential while selecting remaining ones of said plurality of source switches associated with remaining unselected ones of said plurality of blocks to couple source regions of said a number of said plurality of electrically programmable and electrically erasable memory cells in said remaining unselected ones of said plurality of blocks to said second potential, wherein said second potential has a potential level that prevents each of said number of said plurality of electrically programmable and electrically erasable memory cells in each of said remaining unselected ones of said plurality of blocks from being disturbed by said programming potential, and for selecting during erasing one of said plurality of blocks for erasing by selecting one of said plurality of source switches to couple the source regions of a number of said plurality of electrically programmable and electrically erasable memory cells in said selected one of said plurality of blocks for erasing to said third potential while selecting remaining ones of said plurality of source switches associated with remaining unselected ones of said plurality of blocks for erasing to couple source regions of a number of plurality of electrically programmable and electrically erasable memory cells in remaining unselected ones of said plurality of blocks for erasing to said first potential.

2. The memory defined by claim 1 wherein said first potential is ground potential.

3. The memory defined by claim 2 wherein said second potential is approximately +3.5 volts.

4. The memory defined by claim 3 wherein said third potential is +12 volts.

5. The memory defined by claim 1 or 4, wherein said plurality of word lines are formed from strips of polysilicon which strips form said control gates of said plurality of electrically programmable and electrically erasable memory cells along said plurality of word lines.

6. The memory defined by claim 1, wherein during programming a third decoder means couples the drain region of each of said plurality of electrically programmable and electrically erasable memory cells along each of said selected set of said plurality of generally parallel bit lines to said programming potential and the drain region of each one of said plurality of electrically programmable and electrically erasable memory cells along each of remaining unselected ones of said plurality of generally parallel bit lines in both the selected one and the remaining unselected ones of said plurality of blocks to ground, and during erasing wherein said third decoder means allows the drain region of each of said plurality of electrically programmable and electrically erasable cells memory electrically float.

7. The memory defined by claim 5, wherein during programming a third decoder means couples the drain region of said plurality of electrically programmable and electrically erasable memory cells along of said selected set of said plurality of generally parallel bit lines to said programming potential and the drain region of said plurality of electrically programmable and electrically erasable memory cells along each of remaining unselected ones of said plurality of generally parallel bit lines in both the selected one and the remaining unselected ones of said plurality of blocks to ground, and during erasing wherein said third decoder means allows the drain region of all of said plurality of electrically programmable and electrically erasable memory cells to electrically float.

8. An electrically programmable and electrically erasable memory comprising:

a plurality of generally parallel word lines;

a plurality of generally parallel bit lines, said plurality of generally parallel bit lines being perpendicular to said plurality of generally parallel word lines;

a plurality of memory cells that are electrically programmable and electrically erasable, one associated with each intersection of said plurality of generally parallel bit lines and said plurality of generally parallel word lines, each of said plurality of memory cells having a first region, a second region and a control gate, said control gate being formed with its respective one of said plurality of generally parallel word lines, said first region of said plurality of memory cells being coupled to its respective one of said plurality of generally parallel bit lines;

a plurality of switching means each coupled to one of a plurality of blocks, wherein of each of said plurality of blocks includes a number of said plurality of memory cells along a number of adjacent ones of said plurality of generally parallel bit lines, wherein each of said plurality of switching means is for selectively coupling said second region of said number of said plurality of memory cells in each of said plurality of blocks to one of a first potential, a second potential and a third potential;

first decoding means for receiving first address signals and for selecting at least a selected one of said plurality of generally parallel word lines, such that a potential is applied to all of said plurality of memory cells along said selected one of said plurality of generally parallel word lines when selected, said first decoder means being coupled to said plurality of generally parallel word lines;

second decoding means for receiving second address signals for selecting at least one of said plurality of generally parallel bit lines in a selected one of said plurality of blocks, said second decoding means being coupled to said plurality of generally parallel bit lines; and third decoding means for receiving at least part of said second address signals and coupled to said plurality of switching means for coupling said second region of each of said number of said plurality of memory cells in each of said plurality of blocks to one of said first potential, said second potential and said third potential, wherein during programming said third decoding means selects one of said plurality of switching means for coupling said second region of each of said number of said plurality of memory cells in a selected one of said plurality of blocks to said first potential and selects remaining ones of said plurality of switching means for coupling said second region of each of said number of said plurality of memory cells in each of remaining unselected ones of said plurality of blocks to said second potential, wherein said second potential has such a potential level that prevents each of said number of said plurality of electrically programmable and electrically erasable memory cells in each of said remaining unselected ones of said plurality of blocks from being disturbed by said programming potential and from being erased by said second potential, and wherein during erasing said third decoding means selects one of said plurality of switching means for coupling said second region of each of said number of said plurality of memory cells in a selected one of said plurality of blocks to said third potential and selects remaining ones of said plurality of switching means for coupling said second region of each of said number of said plurality of memory cells in each of remaining unselected ones of said plurality of blocks to said first potential.

9. The memory defined by claim 8 wherein said first region is a drain region and said second region, a source region.

10. The memory defined by claim 8, wherein said first potential is a ground potential, said second potential is a disturb inhibit potential, and said third potential is a programming potential.

11. The memory defined by claim 10, wherein said disturb inhibit potential is approximately +3.5 volts.

* * * * *

UNITED STATES PATENT AND TRADEMARK OFFICE
CERTIFICATE OF CORRECTION

PATENT NO. : 5,065,364
DATED : November 12, 1991
INVENTOR(S) : Gregory E. Atwood, et al.

It is certified that error appears in the above-identified patent and that said Letters Patent is hereby corrected as shown below:

| | |
|---|---|
| Col. 4, Line 69 | After the ")" Delete "." Insert --,--. |
| Col. 6, Line 57 | Delete "gnerally"    Insert --generally-- |
| Col. 8, Line 2 | Delete "erasable cells memory electrically float." |
| Col. 8, Line 2 | Insert --erasable memory cells to electrically float.-- |
| Col. 8, Line 6 | After the word "along"   Insert --each-- |

Signed and Sealed this

Seventh Day of June, 1994

Attest:

BRUCE LEHMAN

Attesting Officer

Commissioner of Patents and Trademarks